United States Patent [19]
Shin

[11] Patent Number: 6,107,871
[45] Date of Patent: Aug. 22, 2000

[54] DOUBLE SAMPLING ANALOG LOW PASS FILTER

[75] Inventor: Yun Tae Shin, Kyoungki-do, Rep. of Korea

[73] Assignee: Hyundai Electronics Industries Co., Ltd., Ichon, Rep. of Korea

[21] Appl. No.: 09/106,262

[22] Filed: Jun. 29, 1998

[30] Foreign Application Priority Data

Jun. 30, 1997 [KR] Rep. of Korea .................. 97-29634

[51] Int. Cl.[7] .................................................. H03K 5/00
[52] U.S. Cl. ...................... 327/554; 327/552; 327/558; 330/9
[58] Field of Search ................ 327/554, 91; 330/9; 333/173

[56] References Cited

U.S. PATENT DOCUMENTS

| 5,218,448 | 6/1993 | Honjo et al. ......................... 386/22 |
| 5,341,050 | 8/1994 | Mellissinos et al. ................. 327/91 |

FOREIGN PATENT DOCUMENTS

| 0 080 234 A1 | 6/1983 | European Pat. Off. ....... H03H 11/12 |
| 63-56095 | 6/1988 | Japan . |
| 404138712A | 5/1992 | Japan ................................. 327/382 |

OTHER PUBLICATIONS

Ismail et al., "New Fully–Integrated Mosfet–Capacitor Active Filters", Jun. 1985, pp. 1435–1438.
Millman et al., "Microelectronics", 1988, McGraw–Hill, pp. 751–752.

*Primary Examiner*—Dinh T. Le
*Attorney, Agent, or Firm*—Jacobson, Price, Holman & Stern, PLLC

[57] ABSTRACT

A double sampling analog low pass filter for converting differential inputs of first and second analog signals into a single-ended output signal. The double sampling analog low pass filter having first and second input terminals and a final output terminal includes a first charging/discharging means including at lest one charge storing means, and for charging and/or discharging the charge storing means in response to at least one control signal on receiving a first analog input signal from the first input terminal and a second charging/discharging means including at least one charge storing means, and for charging and/or discharging the charge storing means in response to at least one control signal on receiving a second analog input signal from the second input terminal. A differential input single-ended output operational amplifier amplifies the difference between outputs from the first and second charging/discharging means. A gain control and pole generating means controls a gain of the differential input single-ended output operational amplifier and generates a pole of a transfer function of the differential input single-ended output operational amplifier.

8 Claims, 5 Drawing Sheets

6,107,871

DOUBLE SAMPLING ANALOG LOW PASS FILTER

FIELD OF THE INVENTION

The present invention relates to a double sampling analog low pass filter for eliminating high frequency signals while converting differential inputs into single-ended output by using analog switches, capacitor combinations and a differential input-single ended operational amplifier.

BACKGROUND OF THE INVENTION

Generally, although a signal processing is carried out in a way of differential inputs and differential outputs, the final output signal should be in the form of single-ended output signal in order to achieve a high dynamic range in case of such as audio analog signals.

Further, a differential input differential output operational amplifier (also referred to as a fully differential operational amplifier) is generally used to improve the dynamic range and the power supply rejection ratio ("PSRR") of the sigma-delta ("ΣΔ") digital-to-analog converter ("DAC"), such as audio and voice DACs, to which an oversampling method is applied. In this case, however, the single-ended output converting circuit is also needed to provide the single final output. Moreover, this differential input single-ended output generally has an additional function of low pass filtering.

FIG. 1 shows one example of conventional differential input single-ended output analog low pass filter used in the audio DAC of Burr-Brown company. As shown in the drawing, 6 passive resistors R1 to R6 and four (4) capacitors C1 to C4 are organized to function as a secondary low pass filter.

However, the conventional differential input single-ended output analog low pass filter needs a large chip area when implemented on a semiconductor chip. Further, in case the pole of the filter moves to low frequency range, the RC time constant of the filter should be made larger than that of high frequency range case. As a result, the needed chip area will be much larger. As described above, the large chip area of the conventional filter results from the number of the passive resistors and the capacitors.

SUMMARY OF THE INVENTION

Therefore, the present invention has been made in view of the above mentioned problem, and the present invention provides a double sampling analog low pass filter which consumes less chip area while converting analog differential input signals into single-ended output with high precision characteristics.

In accordance with an aspect of the present invention, there is disclosed a double sampling analog low pass filter for converting differential inputs of first and second analog signals into a single-ended output signal, the double sampling analog low pass filter having a first and a second input terminals and a final output terminal, including : a first charging/discharging means including at least one charge storing means, and for charging and/or discharging the charge storing means in response to at least one control signal on receiving a first analog input signal from the first input terminal; a second charging/discharging means including at least one charge storing means, and for charging and/or discharging the charge storing means in response to at least one control signal on receiving a second analog input signal from the second input terminal; a differential input single-ended output operational amplifier for amplifying the difference between outputs from the first and second charging/discharging means; a gain control and pole generating means for controlling a gain of the differential input single-ended output operational amplifier and generating a pole of a transfer function of the differential input single-ended output operational amplifier, the gain control and pole generating means being coupled to an input terminal of the differential input single-ended output operational amplifier and to the final output terminal; and a low pass filtering means for filtering an amplified signal from the differential input single-ended output operational amplifier, and then transferring a filtered signal to the final output terminal.

BRIEF DESCRIPTION OF THE DRAWINGS

A further understanding of the nature and advantage of the present invention will become apparent by reference to the remaining portions of the specification and drawings, in which.

DETAILED DESCRIPTION OF THE PREFERRED EMBODIMENT

A detailed description of an embodiment according to the present invention will be given below with reference to FIG. 2.

Figure 1:
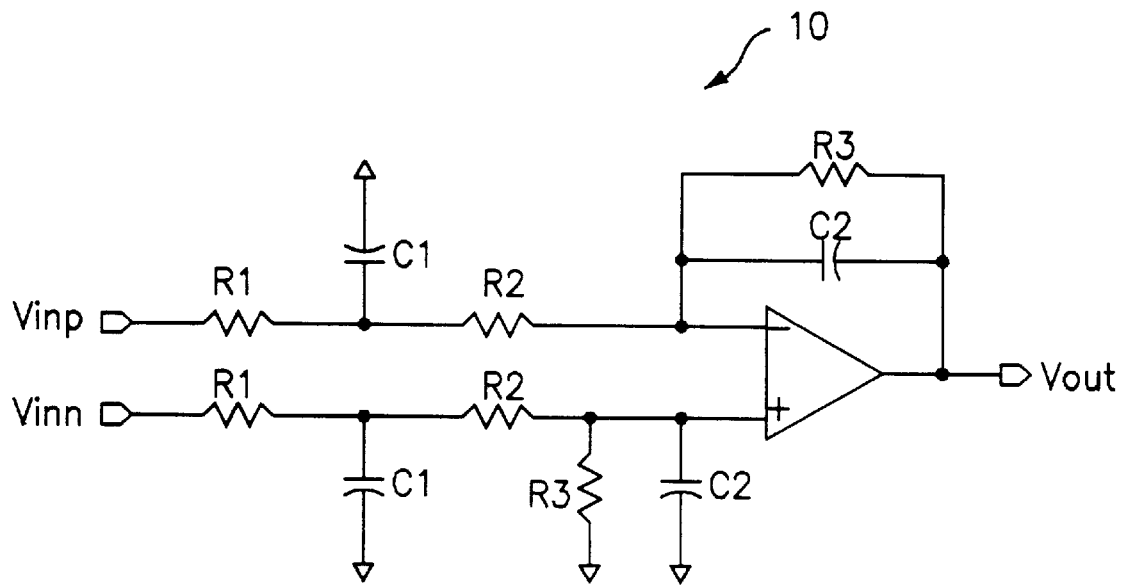
FIG. 1 is a circuit diagram of a conventional analog low pass filter.
Figure 2:
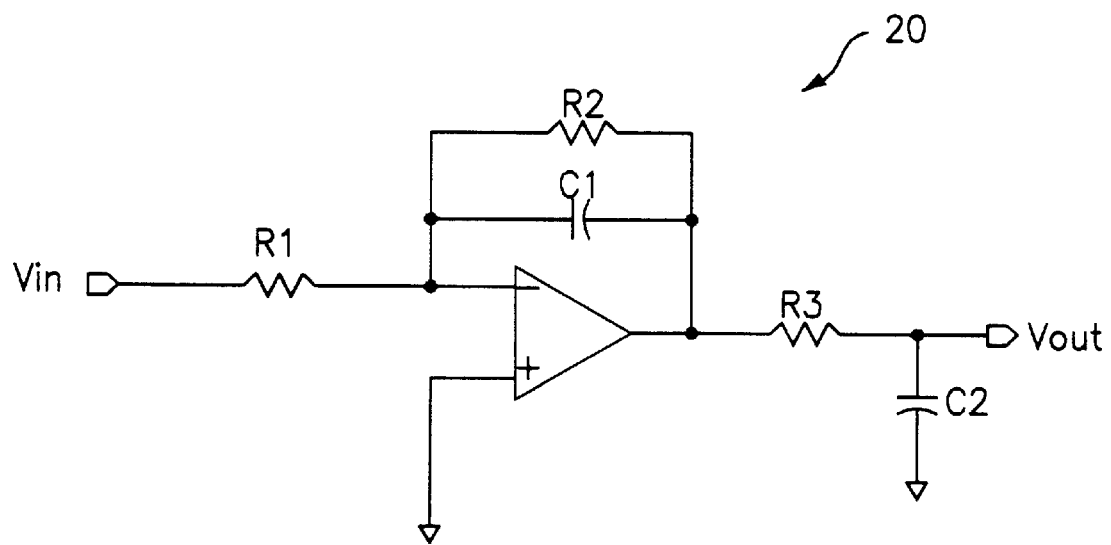
FIG. 2 is a circuit diagram of another conventional single input single-ended output analog low pass filter to explain a principle of the present invention.

Referring to FIG. 2, a circuit diagram of another conventional single input single-ended output analog secondary low pass filter 20 is shown. The transfer function (Vout/Vin) of the low pass filter 20 of FIG. 2 is as follows:

$$\frac{V_{out}}{V_{in}} = -\frac{K}{(S+P_1)(S+P_2)} \quad (1)$$

$$= -\left(\frac{\frac{1}{R_1 C_1}}{S + \frac{1}{R_2 C_1}}\right)\left(\frac{\frac{1}{R_3 C_2}}{S + \frac{1}{R_3 C_2}}\right)$$

where the pole P1 is $$\frac{1}{2\pi R_2 C_1}.$$

and the pole P2 is $$\frac{1}{2\pi R_3 C_2}.$$

Figure 3:
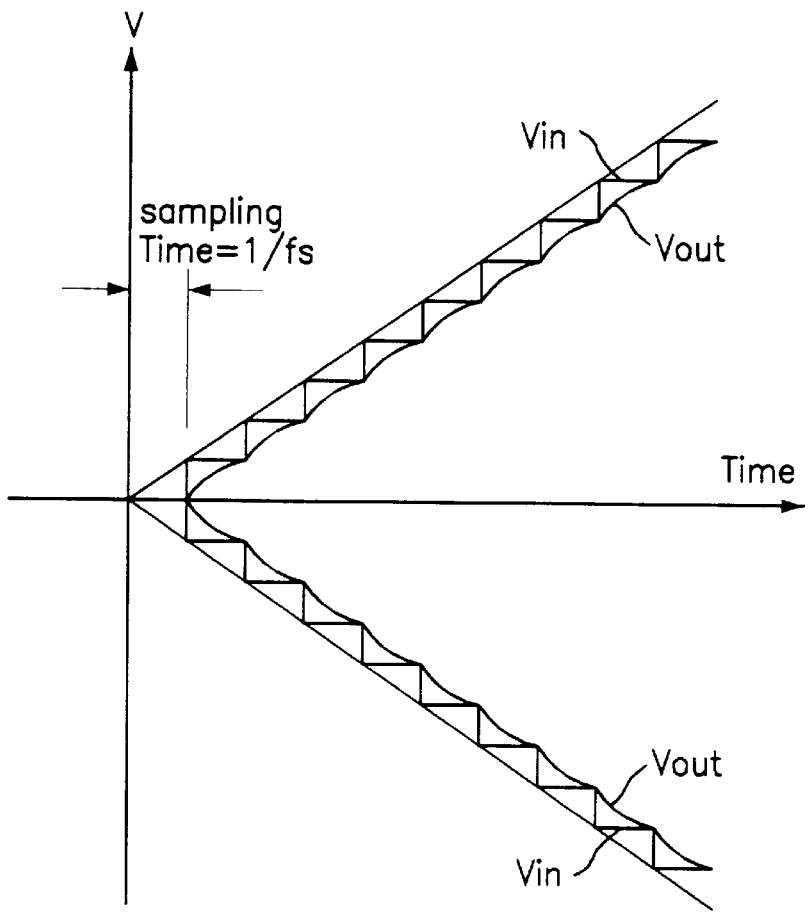
FIG. 3 is Vin-Vout characteristic curve of the low pass filter of FIG. 2.

If the input Vin of the low pass filter 20 is sample-and-hold signal by e.g. a switched-capacitor filter, the output Vout is the signal from which the high frequency component is eliminated, as shown in FIG. 3.

Figure 4:
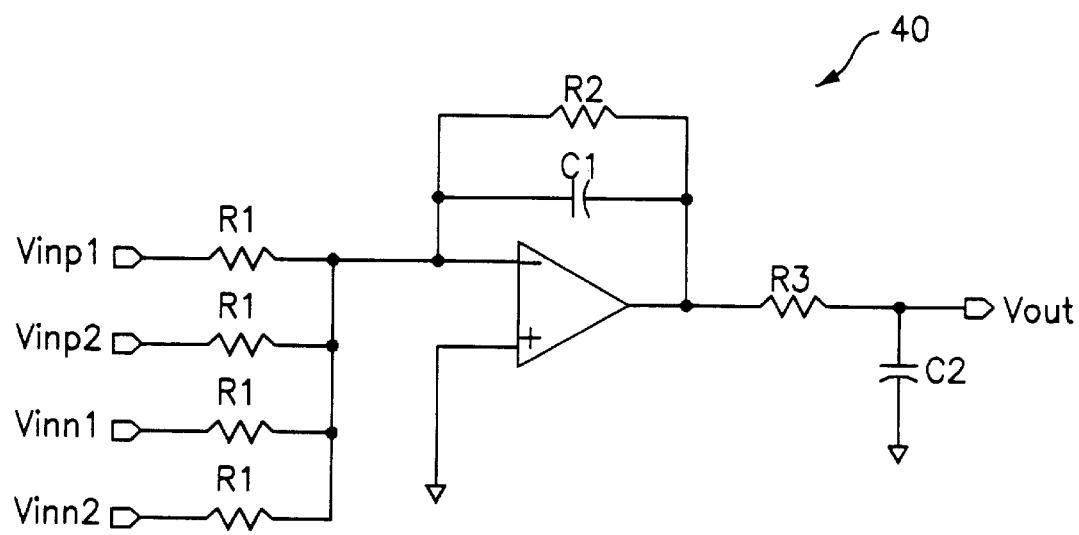
FIG. 4 is a circuit diagram of further another conventional analog low pass filter to explain a principle of the present invention.

Another conventional low pass filter 40 is shown in FIG. 4. In this case, the output Vout of the low pass filter 40 is as follows:

$$V_{out} = -\left[\left(\frac{\frac{1}{R_1 C_1}}{S + \frac{1}{R_2 C_1}}\right)V_{inp1} + \left(\frac{\frac{1}{R_1 C_1}}{S + \frac{1}{R_2 C_1}}\right)V_{inp2} + \left(\frac{\frac{1}{R_1 C_1}}{S + \frac{1}{R_2 C_1}}\right)V_{inn1} + \left(\frac{\frac{1}{R_1 C_1}}{S + \frac{1}{R_2 C_1}}\right)V_{inn2}\right]\left(\frac{\frac{1}{R_3 C_2}}{S + \frac{1}{R_3 C_2}}\right) \quad (2)$$

Here, if Vinp1=Vinp2 $\triangleq$ Vinp, Vinn1=Vinn2 $\triangleq$ Vinn and the inputs are differential with each other, i.e. Vinp=−Vinn, then $$\text{Vinp} = -\text{Vinn} \triangleq \text{Vin} \quad (3)$$

and, the above equation (2) becomes as follows:

$$V_{out} = -\left[\left(\frac{\frac{2}{R_1 C_1}}{S + \frac{1}{R_2 C_1}}\right)V_{inp} - \left(\frac{\frac{2}{R_1 C_1}}{S + \frac{1}{R_2 C_1}}\right)V_{inn}\right]\left(\frac{\frac{1}{R_3 C_2}}{S + \frac{1}{R_3 C_2}}\right)$$

$$= -\left(\frac{\frac{4}{R_1 C_1}}{S + \frac{1}{R_2 C_1}}\right)\left(\frac{\frac{1}{R_3 C_2}}{S + \frac{1}{R_3 C_2}}\right)V_{in}$$

Therefore, the transfer function Vout/Vin is written as follows:

$$\frac{V_{out}}{V_{in}} = -\left(\frac{\frac{4}{R_1 C_1}}{S + \frac{1}{R_2 C_1}}\right)\left(\frac{\frac{1}{R_3 C_2}}{S + \frac{1}{R_3 C_2}}\right) \quad (4)$$

and the low pass filter 40 operates as a secondary low pass filter.

Figure 5:
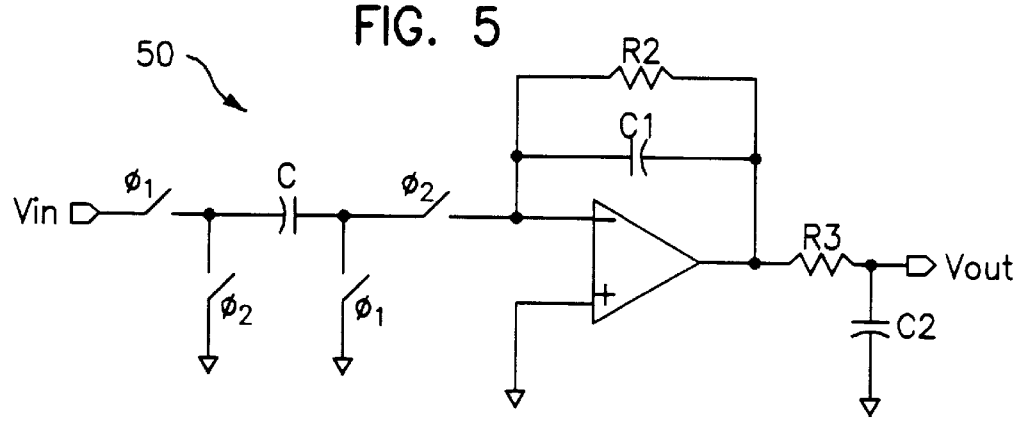
FIG. 5 is a circuit diagram of still another conventional analog low pass filter to explain a principle of the present invention.

As shown in the equations (1) and (4), since the gain in equation (4) is four (4) times larger than that of equation (1), the same output signal can be obtained by having the value of the passive resistor R1 in FIG. 4 to be four (4) times of the original value. In other words, if the passive resistor R1 is replace by a resistor of which the resistance is 4R1, the capacitance C of the capacitor is of 1/(4fsR1), where fs is the sampling frequency and the resistance R is of 1/(fsC). It means that if the passive resistor R1 is replaced by 4R1 by switched-capacitor method, the low pass filter 40 becomes a low pass filter 50 shown in FIG. 5, and the transfer function of the low pass filter 50 is as follows:

$$\frac{V_{out}}{V_{in}} = -\left(\frac{\frac{f_s C}{C_1}}{S + \frac{1}{R_2 C_1}}\right)\left(\frac{\frac{1}{R_3 C_2}}{S + \frac{1}{R_3 C_2}}\right) \quad (5)$$

which is similar to the equation (1).

Further, the low pass filter 40 operates in a similar manner as the low pass filter 20 operates. (In FIG. 5, φ1 and φ2 are complementary switching clocks applied to the gates of the analog switches.)

Figure 6:
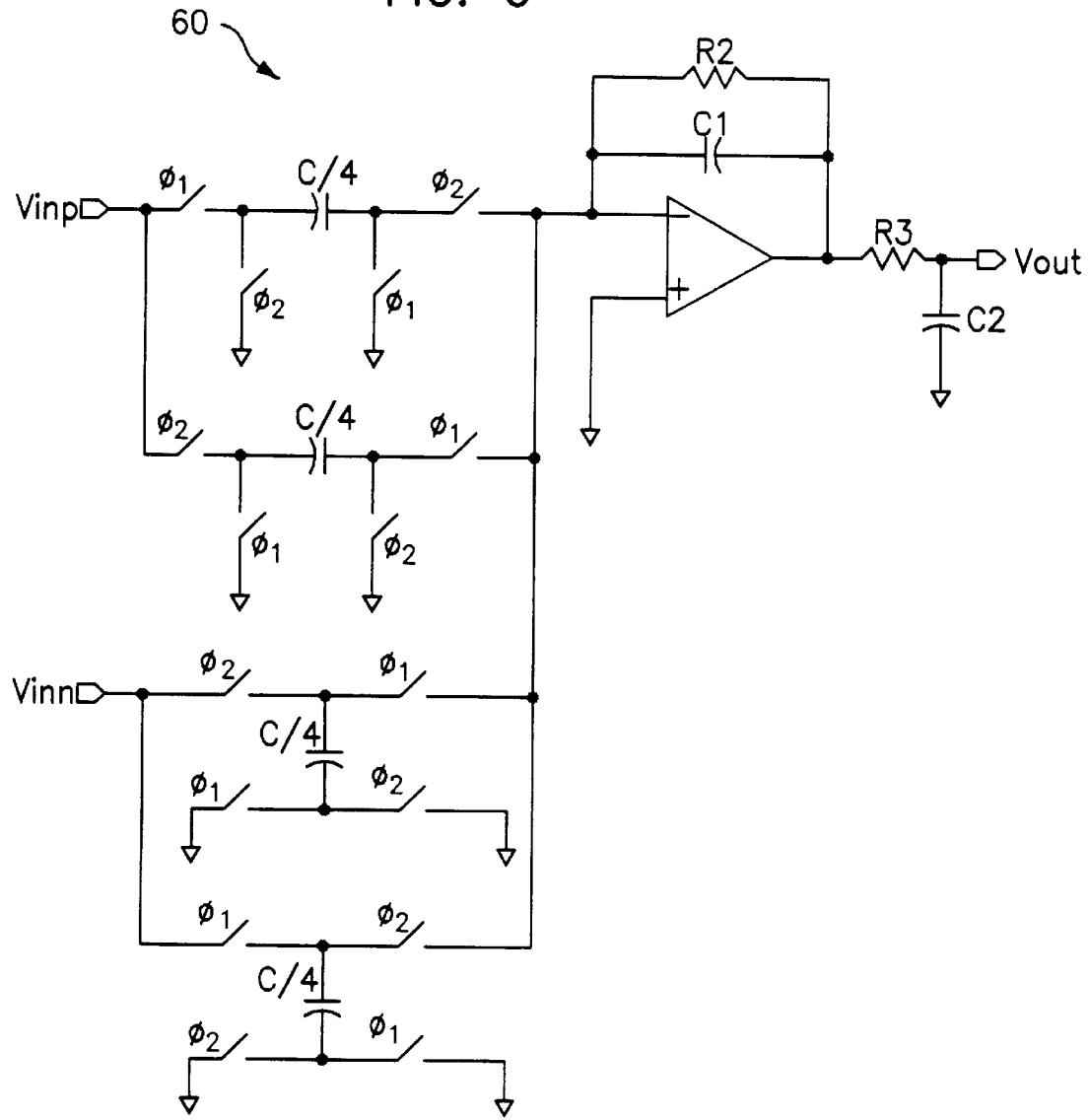
FIG. 6 is a circuit diagram of still another conventional analog low pass filter to explain a principle of the present invention.

Similarly, if the above mentioned switched-capacitor method is applied to a differential input case, the low pass filter 40 becomes a low pass filter 60 shown in FIG. 6. The capacitance C' of the capacitors used in the low pass filter 60 is a quarter of the capacitance C of the capacitor used in the low pass filter 40 (i.e. C'=C/4). As shown in the figure, the chip area for the low pass filter 60 can be almost the same as that for the low pass filter 50. Further, the operation of the low pass filter 60 is the same as that of the low pass filter 20.

A detailed description of an embodiment according to the present invention will be given below with reference to the above described principle of the present invention and FIG. 7.

Figure 7:
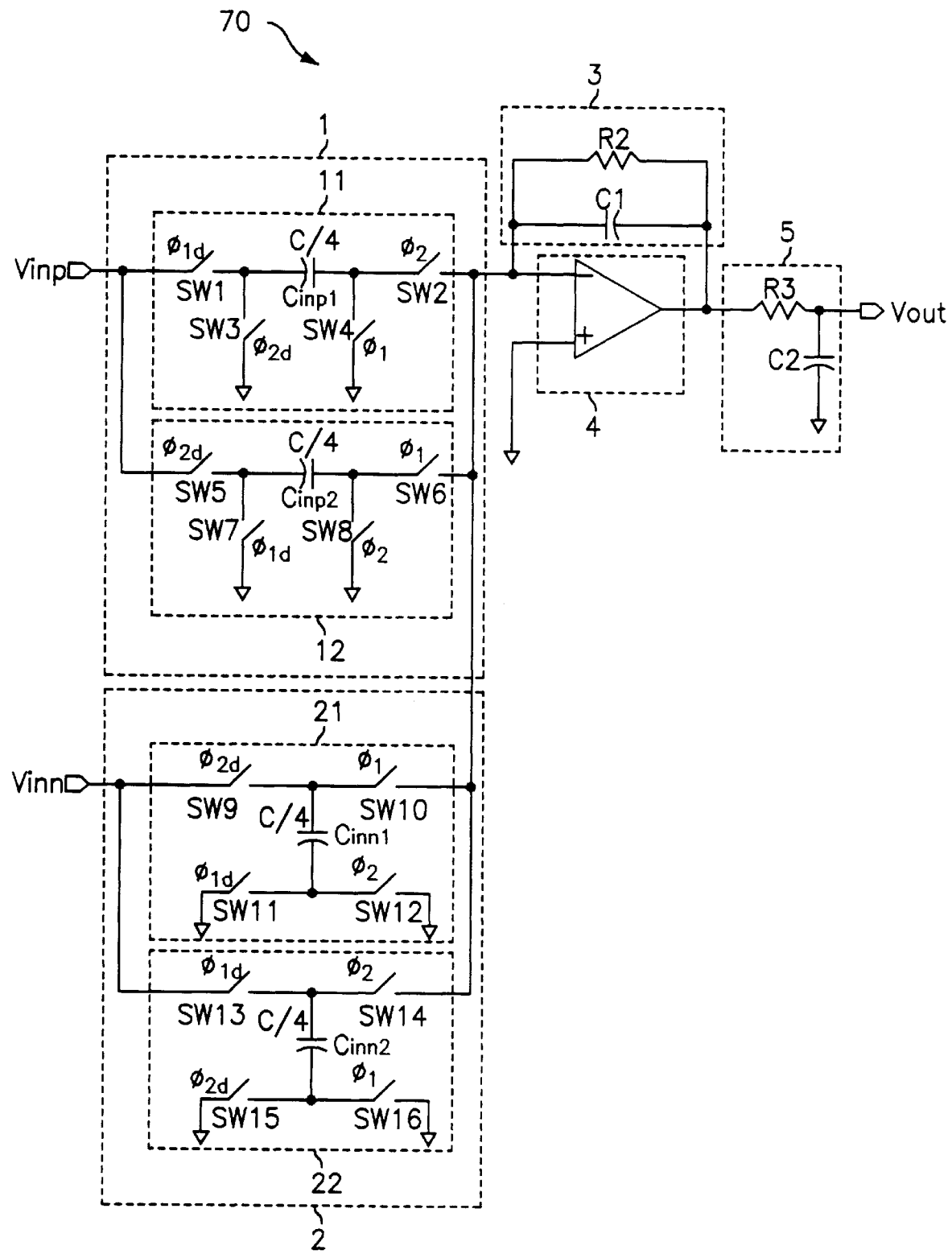
FIG. 7 is a circuit diagram of analog low pass filter according to the present invention.

FIG. 7 is a circuit diagram of analog low pass filter according to the present invention for converting differential inputs to single-ended output. As shown in FIG. 7, a low pass filter 70 includes first and second analog signal charging/discharging means 1 and 2 for receiving differential analog signals Vinp and Vinn and charging and/or discharging capacitors, a differential inputs single-ended operational amplifier 4 for amplifying the difference between the input terminals. The negative (−) input terminal of the operational amplifier 4 is coupled to the common output terminal of the analog signal charging/discharging means 1 and 2 and the positive (+) input terminal thereof is coupled to the ground. Also, a gain control and pole generating means 3 coupled between the negative (−) input terminal and the output terminal of the operational amplifier 4 for controlling the gain of the operational amplifier 4, and generating the pole of the transfer function of the operational amplifier 4. A low pass filtering means 5 coupled between the output terminal of the operational amplifier 4 and final single-ended output terminal Vout for filtering the output signal of the operational amplifier 4.

The analog signal charging/discharging means 1 charges the capacitors Cinp1 and Cinp2 while receiving the analog input signal Vinp and discharges the capacitors Cinp1 and Cinp2 to the negative input terminal of the operational amplifier 4. Similarly, another analog signal charging/discharging means 2 charges the capacitors Cinn1 and Cinn2 while receiving another analog input signal Vinn and discharges the capacitors Cinn1 and Cinn2 to the negative input terminal of the operational amplifier 4.

The analog signal charging/discharging means 1 includes first and second charging/discharging units 11 and 12 for respectively charging and/or discharging the capacitors Cinp1 and Cinp2 with the analog input signal Vinp in response to the operation of switches sw1 to sw8, wherein each of the charging/discharging units 11 and 12 include four (4) analog switches and a capacitor.

The first charging/discharging unit 11 includes the first switch sw1 coupled to the input terminal for switching the input signal Vinp, the first capacitor Cinp1 coupled to the first switch sw1, the second switch sw2 coupled to the first capacitor Cinp1 and the negative input terminal of the operational amplifier 4, the third switch sw3 coupled to the first capacitor Cinp1 and the ground, and the fourth switch sw4 coupled to the first capacitor Cinp1 and the ground.

The second charging/discharging unit 12 includes the fifth switch sw5 coupled to the input terminal for switching the input signal Vinp, the second capacitor Cinp2 coupled to the fifth switch sw5, the sixth switch sw6 coupled to the second capacitor Cinp2 and the negative input terminal of the operational amplifier 4, the seventh switch sw7 coupled to the second capacitor Cinp2 and the ground, and the eighth switch sw8 coupled to the second capacitor Cinp2 and the ground.

Further, the second analog signal charging/discharging means 2 includes third and fourth charging/discharging units 21 and 22 for respectively charging and/or discharging the capacitors Cinn1 and Cinn2 with another analog input signal Vinn in response to the operation of switches sw9 to sw16, wherein each of the charging/discharging units 21 and 22 include four (4) analog switches and a capacitor.

The third charging/discharging unit 21 includes the ninth switch sw9 coupled to another input terminal for switching the input signal Vinn, the tenth switch sw10 coupled to the ninth switch sw9 and the negative input terminal of the operational amplifier 4, the third capacitor Cinn1 coupled to the node between the ninth and the tenth switch sw9 and sw10, the eleventh switch sw11 coupled to the third capacitor Cinn1 and the ground, and the twelfth switch sw12 also coupled to the third capacitor Cinn1 and the ground.

The fourth charging/discharging unit 22 includes the thirteenth switch sw13 coupled to another input terminal for switching the input signal Vinn, the fourteenth switch sw14 coupled to the thirteenth switch sw13 and the negative input terminal of the operational amplifier 4, the fourth capacitor Cinn2 coupled to the node between the thirteenth and the fourteenth switch sw13 and sw14, the fifteenth switch sw15 coupled to the fourth capacitor Cinn2 and the ground, and the sixteenth switch sw16 also coupled to the fourth capacitor Cinn2 and the ground.

The switches sw1 to sw16 are grouped into four groups which receives four clock signals out of phases, wherein the frequencies of the signals are commonly fs. The switches sw1 to sw16 charge and/or discharge the corresponding capacitors Cinp1, Cinp2, Cinn1, and Cinn2 in response to the signals, as described hereinafter.

Figure 8:
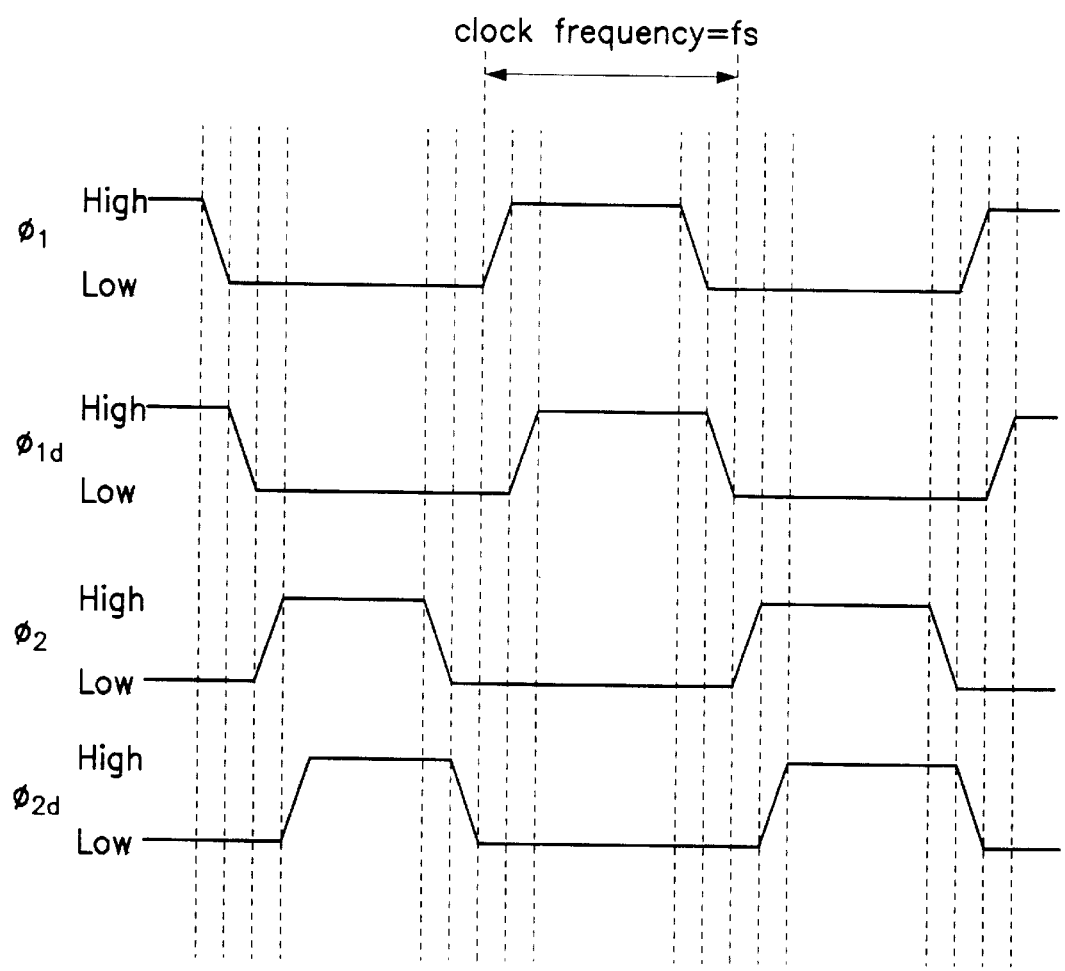
FIG. 8 is a timing diagram of the analog low pass filter of FIG. 7.

Now, with reference to FIG. 8, the switching operations of the switches sw1 to sw16 will be described in detail. FIG. 8 is a timing diagram of the clock signals applied to the switches sw1 to sw16. When the signal is "High", the switch to which the signal is applied is turned on, and when the signal is "Low", the switch is turned off.

As shown in FIG. 7, the switches sw4, sw6, sw10 and sw16 receives a first clock $\phi 1$, the switches sw1, sw7, sw11 and sw13 receives a delayed first clock $\phi 1d$, the switches sw2, sw8, sw12 and sw14 receives a second clock $\phi 2$ and the switches sw3, sw5, sw9 and sw15 receives a delayed second clock $\phi 2d$. Further, as shown in FIG. 8, the first clock $\phi 1$ and the second clock $\phi 2$ is about 180 degree out of phase. In other words, when one signal is "High", the other one is "low", and vice versa.

When the first clock $\phi 1$ and the delayed first clock $\phi 1d$ sequentially become "High", the switches sw1 and sw4 of the first charging/discharging unit 11 are turned on so that the input voltage Vinp is transferred to charge the first capacitor Cinp1, and the switches sw6 and sw7 of the second charging/discharging unit 12 are turned on so that the previously charged voltage Vinp of the capacitor Cinp2 is discharged and transferred to the negative input terminal of the operational amplifier 4.

Then, after the first clock $\phi 1$ and the delayed first clock $\phi 1d$ sequentially become "Low" and when the second clock $\phi 2$ and the delayed second clock $\phi 2d$ sequentially become "High", the switches sw2 and sw3 of the charging/discharging unit 11 are turned on so that the previously charged voltage Vinp of the capacitor Cinp1 is discharged and transferred to the negative input terminal of the operational amplifier 4. Further, the switches sw5 and sw8 of the second charging/discharging unit 12 are turned on so that the input voltage Vinp is transferred to charge the first capacitor Cinp2.

As described above, since the charging/discharging means 1 or 2 charges and discharges the capacitor during one clock cycle, the low pass filter 70 of the present invention performs a double sampling operation.

Similarly, when the first clock $\phi 1$ and the delayed first clock $\phi 1d$ sequentially become "High", the switches sw10 and sw11 of the third charging/discharging unit 21 are turned on so that the previously charged voltage Vinn of the capacitor Cinn1 is discharged and transferred to the negative input terminal of the operational amplifier 4, and the switches sw13 and sw16 of the fourth charging/discharging unit 22 are turned on so that the input voltage Vinn is transferred to charge the fourth capacitor Cinn2.

Then, after the first clock $\phi 1$ and the delayed first clock $\phi 1d$ sequentially become "Low" and when the second clock $\phi 2$ and the delayed second clock $\phi 2d$ sequentially become "High", the switches sw9 and sw12 of the third charging/discharging unit 21 are turned on so that the input voltage Vinn is transferred to charge the third capacitor Cinn1, and the switches sw14 and sw15 of the fourth charging/discharging unit 22 are turned on so that the previously charged voltage Vinn of the capacitor Cinn2 is discharged and transferred to the negative input terminal of the operational amplifier 4. It also performs the double sampling operation.

While the second clock $\phi 2$ and the delayed second clock $\phi 2d$ are "High", the amount of charges transferred from the charging/discharging units 11 and 22 to the negative input terminal of the operational amplifier 4 is as follows:

$$C(Vinp-Vinn)/4 = 2Vinp \cdot C/4 \text{ or } -2Vinn \cdot C/4 \quad (6)$$

where Vinp=−Vinn$\underline{\Delta}$ Vin . . . (3).

Further, while the first clock $\phi 1$ and the delayed first clock $\phi 1d$ are "High", the amount of charges transferred from the charging/discharging units 12 and 21 to the negative input terminal of the operational amplifier 4 is as follows:

$$C(Vinp-Vinn)/4 = 2Vinp \cdot C/4 \text{ or } -2Vinn \cdot C/4 \quad (7)$$

where Vinp=−Vinn$\underline{\Delta}$ Vin+tm (3).

Therefore, the total amount of charges transferred to the negative input terminal of the operational amplifier 4 is as follows:

$$\text{Equation (6)} + \text{Equation (7)} = 4Vinp \cdot C/4 = Vinp \cdot C \quad (8)$$

As described above, since the capacitance of each of the capacitors Cinp1, Cinp2, Cinn1 and Cinn2 is of C/4, the gain becomes the value of ¼ of the original value with more accuracies.

The gain control and pole generating means 3 includes a passive resistor R2 coupled between the negative input terminal and the output terminal of the operational amplifier 4 and a capacitor C1 coupled in parallel to the resistor R2. The gain control and pole generating means 3 operates as a first low pass filter with a cutoff frequency f3dB of;

$$f_{3dB} = \frac{1}{2\pi R_2 C_1} \tag{9}$$

Further, the voltage gain K of the gain control and pole generating means 3 is as follows:

$$K = \frac{R_2}{\frac{1}{4f_s \cdot (C/4)}} = R_2 f_g C \tag{10}$$

The differential input single-ended output operational amplifier 4 includes negative and positive input terminals, wherein the positive input terminal is coupled to the ground so that the difference of the two input signals is amplified and outputted from the output terminal.

The low pass filtering means 5 includes a passive resistor R3 coupled between the output terminal of the operational amplifier 4 and the final output terminal Vout of the low pass filter 70, and a capacitor C2 coupled between the final output terminal Vout and the ground. The low pass filtering means 5 operates as a secondary low pass filter with a cutoff frequency f3dB of;

$$f_{3dB} = \frac{1}{2\pi R_3 C_2} \tag{11}$$

Further, the voltage gain K of the low pass filtering means 5 is expressed as follows:

$$K=1 \tag{12}$$

The filtered signal by the low pass filtering means 5 is outputted as analog output signal from the final output terminal Vout.

As described above, the low pass filter 70 of the present invention operates as a secondary double sampling analog low pass filter. However, it is also possible for the low pass filter 70 to be designed to operate as a higher stage low pass filter.

Further, the low pass filter 70 of the present invention is applicable to the audio digital-to-analog converter or voice communication integrated circuit where a high precision processing of the analog signal is required and the THD is required to be lower than 0.01%. The chip area needed to implement is smaller and the capacitor matching is easier than the conventional low pass filter.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A double sampling analog low pass filter for converting differential inputs of first and second analog signals into a single-ended output signal, said double sampling analog low pass filter having a first and a second input terminals and a final output terminal, comprising:

a first charging/discharging means comprising at least one first charge storing means, and for charging and/or discharging said charge storing means in response to said first analog input signal from said first input terminal;

a second charging/discharging means comprising at least one second charge storing means, and for charging and/or discharging said charge storing means in response to said second analog input signal from said second input terminal;

a differential input single-ended output operational amplifier having an input terminal coupled to said first and second charging/discharging means for amplifying a difference between outputs from said first and second charging/discharging means;

a gain means in combination with said first charging/discharging means for controlling a gain of said differential input single-ended output operational amplifier and a pole generating means for generating a pole of a transfer function of said differential input single-ended output operational amplifier, said gain control and pole generating means being coupled to said input terminal and an output terminal of said differential input single-ended output operational amplifier; and a low pass filtering means for filtering an amplified signal from said differential input single-ended output operational amplifier, and providing a filtered signal to said final output terminal.

2. A double sampling analog low pass filter as claimed in claim 1, wherein each of said first and second charging/discharging means is responsive to clock signals out of phases for charging and/or discharging said first and second charge storing means.

3. A double sampling analog low pass filter as claimed in claim 2, wherein said first charging/discharging means comprises a plurality of charging/discharging unit for charging and/or discharging said first and second charge storing means with said first analog input signal in response to said clock signals out of phase at different timing from one another.

4. A double sampling analog low pass filter as claimed in claim 3, wherein said charging/discharging unit comprises:

a first switching means for switching said first analog input signal;

a capacitor, one terminal of said capacitor being coupled to said first switching means;

a second switching means coupled to another terminal of said capacitor and to one of said input terminal of said differential input single-ended output operational amplifier;

a third switching means coupled to one terminal of said capacitor and to the ground; and a fourth switching means coupled to another terminal of said capacitor and to the ground, wherein, said fourth switching means is responsive to a first clock signal of said clock signals, said first switching means is responsive to a delayed signal of said first clock signal, said second switching means is responsive to a second clock signal of said clock signals and said third switching means is responsive to a delayed signal of said second clock signal, said first and second clock signal being about 180 degree out of phase, so that said charge storing means are charged and/or discharged at different timing from one another.

5. A double sampling analog low pass filter as claimed in claim 2, wherein said second charging/discharging means comprises a plurality of charging/discharging unit for charging and/or discharging said charge storing means with said second analog input signal in response to said clock signals of different phase at different moments in time from one another.

6. A double sampling analog low pass filter as claimed in claim 5, wherein said charging/discharging unit comprises:

a first switching means for switching said second analog input signal;

a second switching means coupled to said first switching means and to one of said input terminal of said differential input single-ended output operational amplifier;

a capacitor coupled between said first and second switching means; and a third and a fourth switching means coupled to one terminal of said capacitor and to the ground, said third and fourth switching means being parallel in connection, wherein, said second switching means is responsive to a first cloak signal of said clock signals, said third switching means is responsive to a delayed signal of said first clock signal, said fourth switching means is responsive to a second clock signal of said clock signals and said first switching means is responsive to a delayed signal of said second clock signal, said first and second signals being about 180 degree out of phase, so that said charge storing means are charged and/or discharged at different timing from one another.

7. A double sampling analog low pass filter as claimed in claim 5, wherein said gain control and pole generating means comprises a resistor and a capacitor commonly coupled to the input terminal and to said output terminal of said differential input single-ended output operational amplifier.

8. A double sampling analog low pass filter as claimed in claim 5, wherein said low pass filtering means comprises:

a resistor coupled to the output terminal of said differential input single-ended output operational amplifier and to said final output terminal; and a capacitor coupled to said final output terminal.

* * * * *